(12) United States Patent
Fukaura et al.

(10) Patent No.: US 7,331,228 B2
(45) Date of Patent: Feb. 19, 2008

(54) ACCELERATION SENSOR

(75) Inventors: Teruya Fukaura, Fukuoka (JP);
Shinichiro Katsuki, Fukuoka (JP);
Yutaka Katahara, Tokyo (JP); Seishi Shibata, Fukuoka (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

(21) Appl. No.: 11/257,071

(22) Filed: Oct. 25, 2005

(65) Prior Publication Data
US 2006/0179942 A1    Aug. 17, 2006

(30) Foreign Application Priority Data
Feb. 16, 2005   (JP)   ............... 2005-038637

(51) Int. Cl.
*G01P 15/00* (2006.01)
(52) U.S. Cl. .............. 73/514.16; 73/488; 73/514.35
(58) Field of Classification Search ............ 73/514.16, 73/488, 514.35
See application file for complete search history.

(56) References Cited

U.S. PATENT DOCUMENTS

| | | | | |
|---|---|---|---|---|
| 5,461,917 | A  * | 10/1995 | Marek et al. ............ | 73/514.16 |
| 5,526,687 | A  * | 6/1996 | Ueyanagi ................. | 73/514.16 |
| 5,962,789 | A  * | 10/1999 | Matsunaga et al. ...... | 73/514.38 |
| 6,518,084 | B1 * | 2/2003 | Seitz et al. ................ | 438/53 |
| 6,621,071 | B2 * | 9/2003 | Sobel et al. ............... | 250/238 |
| 6,815,313 | B2 * | 11/2004 | Yatsuda ..................... | 438/458 |
| 7,010,976 | B2 * | 3/2006 | Ozawa et al. ............ | 73/504.12 |
| 2003/0183009 | A1 * | 10/2003 | An et al. ................. | 73/514.16 |
| 2004/0025589 | A1 * | 2/2004 | Kurle et al. .............. | 73/488 |
| 2005/0056096 | A1 * | 3/2005 | Ozawa et al. ............ | 73/514.36 |

FOREIGN PATENT DOCUMENTS

| | | |
|---|---|---|
| DE | 195 26 903 A1 | 1/1997 |
| JP | 6-324077 | 11/1994 |
| JP | 10-115635 | 5/1998 |
| WO | 95/09366 | 4/1995 |
| WO | 00/36387 | 6/2000 |

OTHER PUBLICATIONS

German Office Action, with English-language translation, dated Mar. 28, 2007.

* cited by examiner

*Primary Examiner*—Hezron Williams
*Assistant Examiner*—Samir M. Shah
(74) *Attorney, Agent, or Firm*—Buchanan Ingersoll & Rooney PC

(57) ABSTRACT

An acceleration sensor in accordance with an aspect of the present invention comprises a first substrate, a multilayer second substrate and a sensor portion. The multilayer second substrate is opposed to the first substrate. The multilayer second substrate is provided with an electrode drawing opening. Further, the multilayer second substrate consists of a plurality of layers. The sensor portion (a movable mass body and a fixed electrode) is provided in a sealed cavity portion which is formed between the first substrate and the multilayer second substrate which are opposed to each other.

5 Claims, 6 Drawing Sheets

MOVABLE MASS BODY — FIXED ELECTRODE
SENSOR PORTION

F I G . 1 4
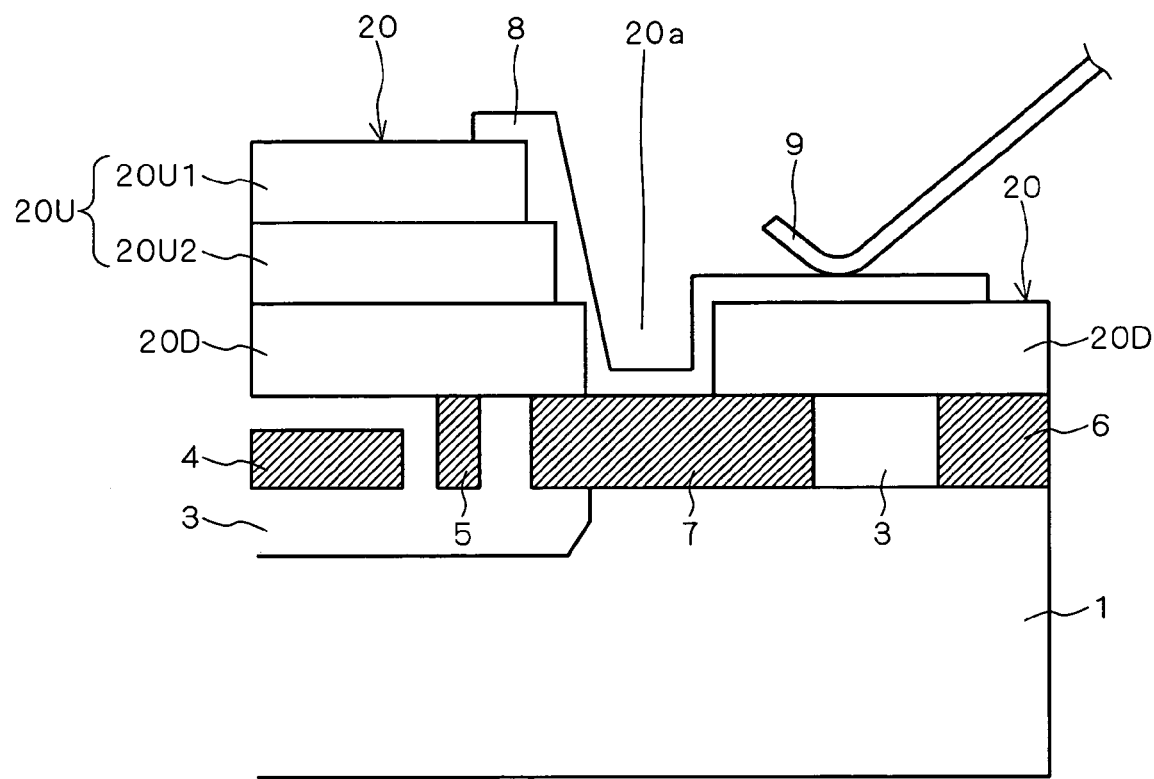

ACCELERATION SENSOR

BACKGROUND OF THE INVENTION

1. Field of the Invention

The present invention relates to an acceleration sensor and can be applied to an acceleration sensor having a sealing upper substrate with an opening facing on an electrode portion.

2. Description of the Background Art

An acceleration sensor has a structure in which a sealing upper substrate and a sealing lower substrate (hereinafter, referred to simply as "upper substrate" and "lower substrate", respectively) seal a sensor portion and the like. Further, the acceleration sensor has an electrode portion provided between the upper substrate and the lower substrate, which is connected to the sensor portion, a fixed electrode and the like.

In order to connect the electrode portion to an external wire, conventionally, an opening is provided in the upper substrate.

Specifically, the opening which faces on the electrode portion is formed in the upper substrate, and then an electrode wire extending from the inside of the opening up to an upper surface of the upper substrate, which is connected to the electrode portion, is formed. In the upper surface of the upper substrate, the electrode wire and the external wire are wire-bonded to each other. Through the external wire and the electrode wire, the electrode portion and an external equipment are thereby connected to each other and a potential of the sensor portion and the like is drawn out and so on from the outside.

For the purpose of protecting the sensor portion from an external pressure, the thicknesses of the upper substrate and the lower substrate are required to be at least 300 to 400 μm or more.

As a method of forming the opening in the upper substrate having such a thickness, the following method is adopted as a background-art technique.

Specifically, a cavity is so formed in the upper substrate as not to penetrate it, up to a predetermined depth by sandblasting, and then the upper substrate and the lower substrate are so bonded to each other as to seal the sensor portion and the like. After that, the cavity is isotropically etched, to form the opening penetrating the upper substrate.

In order to form the opening in the upper substrate having a thickness of about 400 μm, for example, first, a cavity is formed by sandblasting up to a depth of about 300 μm. After that, the upper substrate having a thickness of about 100 μm which is present at a bottom of the cavity is completely removed by isotropic etching. In this isotropic etching, an upper surface of the upper substrate is entirely removed by about 100 μm.

Thus formed is the opening penetrating the upper substrate having a thickness of about 300 μm.

Further, there is a technique where the opening penetrating the upper substrate is formed only by sandblasting, not using isotropic etching.

The background-art acceleration sensor having the opening in the upper substrate is disclosed in Japanese Patent Application Laid Open Gazette No. 10-115635.

The case where the opening is formed in the upper substrate by performing sandblasting and then performing isotropic etching or the case where the opening is formed only by sandblasting has the following problem.

Since the opening is formed by sandblasting and isotropic etching, the upper substrate is also laterally removed and the diameter of the opening thereby increases (in the upper substrate having a thickness of about 300 μm, the opening has a diameter of about 50 to 200 μm at its bottom and a diameter of about 400 μm at its top).

In order to completely seal the cavity portion, it is required that the electrode portion should close the bottom of the opening without any clearance. Therefore, the electrode portion is required to have a size larger than the expected largest diameter of the opening (specifically, the size of the electrode portion=the expected largest diameter+a margin size).

Then, in the above background-art case, since the expected largest diameter is 400 μm, the size of the electrode portion is required to be 400 μm or more. Thus, since the expected largest diameter of the opening (specifically, the diameter at the top of the opening) is large in the above background-art case, the size of the electrode portion is set still larger.

As discussed above, the background-art case has to have the electrode portion of large size, and as a result, has a problem of making the acceleration sensor large in size on the whole.

SUMMARY OF THE INVENTION

It is an object of the present invention to provide an acceleration sensor which allows formation of an opening facing on an electrode portion in an upper substrate while suppressing an increase of its whole size.

The present invention is intended for an acceleration sensor. According to a first aspect of the present invention, the acceleration sensor includes a first substrate, a multilayer second substrate and a sensor portion. The multilayer second substrate is opposed to the first substrate. The multilayer second substrate is provided with an electrode drawing opening. Further, the multilayer second substrate consists of a plurality of layers. The sensor portion is formed between the first substrate and the multilayer second substrate which are opposed to each other. Further, the sensor portion is provided in a sealed cavity portion.

In formation of the opening in the multilayer second substrate, openings are formed in respective layers which constitute the multilayer second substrate and after that, the layers are superimposed on one another and joined to one another. Thus, in this construction, an opening can be formed in each relatively thin layer. Therefore, even if the opening is formed by sandblasting, for example, it is possible to suppress an increase of the largest diameter of the opening.

According to a second aspect of the present invention, the acceleration sensor includes a first substrate, a second substrate and a sensor portion. The second substrate consists of a first layer opposed to the first substrate and one or more second layers formed on part of an upper surface of the first layer. The sensor portion is formed between the first substrate and the second substrate which are opposed to each other. Further, the sensor portion is provided in a sealed cavity portion. The second layers are formed above the sensor portion.

If the electrode sealing opening is formed in a region of the first layer on which no second layer is formed, it is possible to form an opening whose largest diameter is small even if the opening is formed by, e.g., sandblasting. This is because the first layer is relatively thin. Further, the first layer and the second layer are so formed above the sensor portion as to cover it. Therefore, since the thickness of layers above the sensor portion is large, it is possible to strongly protect the sensor portion and the like from an external pressure.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is an enlarged cross section showing a structure of an acceleration sensor in accordance with a third preferred embodiment.

DESCRIPTION OF THE PREFERRED EMBODIMENTS

Hereinafter, the present invention will be discussed, referring to figures showing the preferred embodiments.

The First Preferred Embodiment

Figure 1:
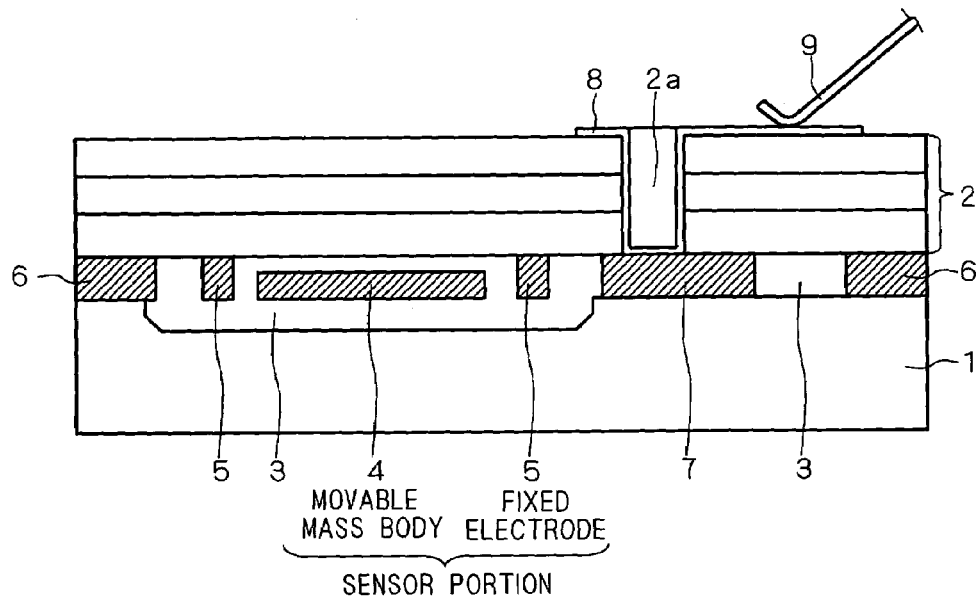
FIG. 1 is a cross section showing an overall structure of an acceleration sensor in accordance with a first preferred embodiment.
Figure 2:
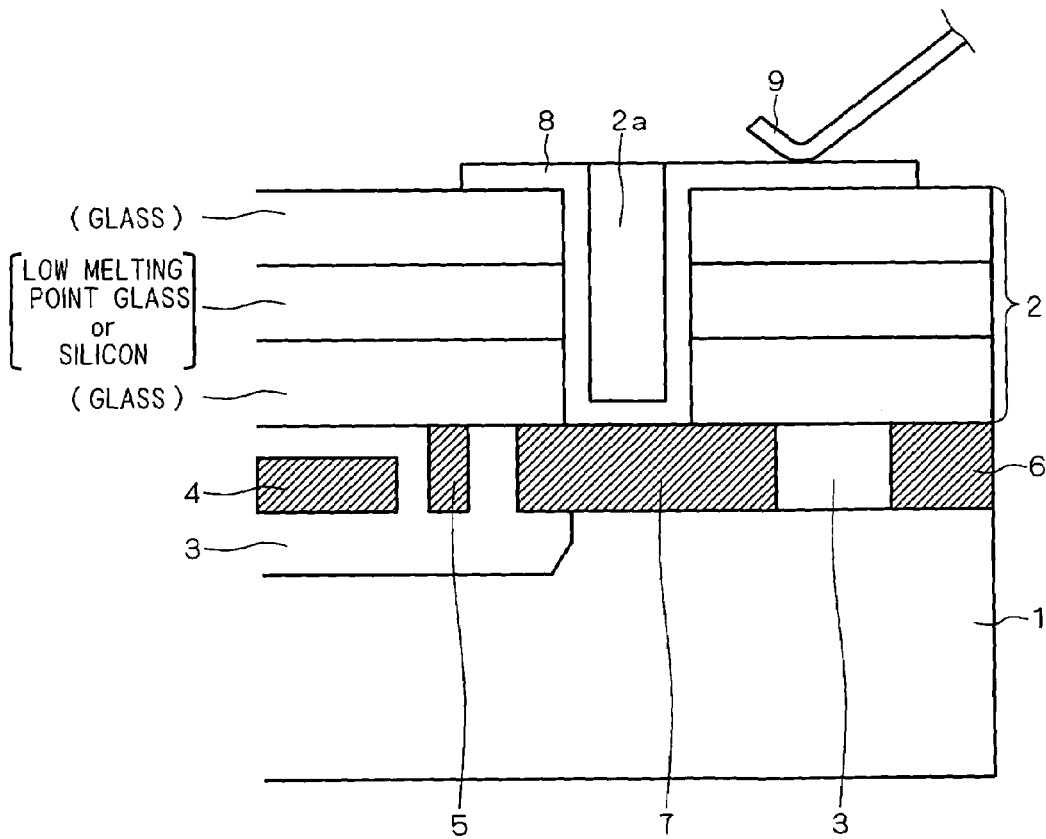
FIG. 2 is an enlarged cross section showing a structure of the acceleration sensor in accordance with the first preferred embodiment.

FIG. 1 is a cross section showing a structure of an acceleration sensor in accordance with the first preferred embodiment. FIG. 2 is an enlarged cross section showing a structure of part of the acceleration sensor of FIG. 1, i.e., an electrode portion 7, an opening 2a and their vicinity. Herein, combination of a movable mass body 4 and a fixed electrode 5 is referred to as a sensor portion.

An actual acceleration sensor has a structure where the shapes of the movable mass body 4, the fixed electrode 5 and the like are more complicated than those shown in FIGS. 1 and 2. In FIGS. 1 and 2, for simple illustration, the shapes of the movable mass body 4 and the fixed electrode 5 and the like are simplified.

As shown in FIGS. 1 and 2, a sealing first substrate (hereinafter, referred to simply as "first substrate") 1 and a sealing multilayer second substrate (hereinafter, referred to simply as "multilayer second substrate") 2 are provided, being opposed to each other.

The first substrate 1 is formed of, e.g., glass and has a thickness of about 400 μm.

The multilayer second substrate 2 consists of a plurality of layers. Specifically, the multilayer second substrate 2 has a multilayer structure in which a glass layer, a low melting point glass layer (or a silicon layer) and a glass layer are laminated from the bottom. Each of the layers constituting the multilayer second substrate 2 has a thickness of about 100 μm.

Further, a sealing cavity portion 3 is formed between the first substrate 1 and the multilayer second substrate 2 which are opposed to each other. In the cavity portion 3, the movable mass body 4 is provided. The movable mass body 4 is so formed as to be freely movable in the cavity portion 3.

Near the movable mass body 4 in the cavity portion 3, the fixed electrodes 5 are provided at predetermined intervals of space.

As discussed above, the movable mass body 4 and the fixed electrode 5 constitute the sensor portion.

By observing variation of static electricity power generated between the movable mass body 4 and the fixed electrode 5, it is possible to measure acceleration applied to the acceleration sensor.

Further, a frame body 6 is formed, being held by the first substrate 1 and the multilayer second substrate 2. The frame body 6 is so formed to surround the cavity portion 3.

In the cavity portion 3, an electrode portion 7 is provided. The electrode portion 7 is connected to either the sensor portion (the movable mass body 4 and the fixed electrode 5) or the frame body 6.

For example, if the electrode portion 7 is an electrode for drawing a potential of the movable mass body 4 (fixed electrode 5) out, the electrode portion 7 is connected to the movable mass body 4 (fixed electrode 5). Further, if the electrode portion 7 is an electrode to set a potential of the frame body 6 to a ground potential, the electrode portion 7 is connected to the frame body 6.

Further, in the multilayer second substrate 2, an electrode drawing opening 2a is formed. The opening 2a is formed, extending from an upper surface of the multilayer second substrate 2 to a lower surface (in other words, the opening 2a is so formed in the multilayer second substrate 2 as to penetrate it from the upper layer to the lower layer). From a bottom surface of the opening 2a, the electrode portion 7 is exposed (in other words, the opening 2a is so formed as to face on an upper surface of the electrode portion 7). The opening 2a has a diameter of about 50 to 200 μm at its bottom and a diameter of about 200 to 300 μm at its top.

Inside the opening 2a, an electrode wire 8 is formed. The electrode wire 8 is connected to the electrode portion 7 and formed from the inside of the opening 2a up to part of an upper surface of the multilayer second substrate 2. The electrode wire 8 has a thickness of about 3 μm.

On the electrode wire 8 provided on the upper surface of the multilayer second substrate 2, an external wire 9 is connected by bonding. Therefore, drawing of a potential, setting of a ground potential and the like between an external equipment and the electrode portion 7 are performed through the external wire 9 and the electrode wire 8.

Next, discussion will be made on a method of manufacturing the acceleration sensor of the first preferred embodiment.

Figure 3:
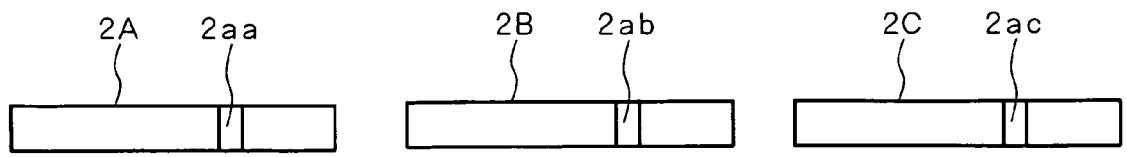
FIGS. 3 to 11 are process cross sections showing a method of manufacturing the acceleration sensor in accordance with the first preferred embodiment.

First, as shown in FIG. 3, a glass layer 2A, a low melting point glass layer (or silicon layer) 2B and a glass layer 2C for constituting the multilayer second substrate 2 are prepared.

Then, as shown in FIG. 3, openings 2aa, 2ab and 2ac which are through holes are formed individually and independently in the layers 2A, 2B and 2C. Formation of the openings 2aa to 2ac is performed by e.g., sandblasting.

Herein, the openings 2aa to 2ac are formed in the layers 2A, 2B and 2C each having a thickness of about 100 μm, respectively, by sandblasting. Each of the openings 2aa to 2ac formed by sandblasting has a cross-sectional shape like a bowl (in FIG. 3, the cross section of each opening has a rectangular shape).

Therefore, if the diameter of each of the openings 2aa to 2ac is about 50 to 200 μm at its bottom, the diameter thereof is about 200 to 300 μm at its top.

In the layers 2A to 2C, the openings 2aa to 2ac have diameters with almost the same size and cross-sectional shape.

Figure 4:
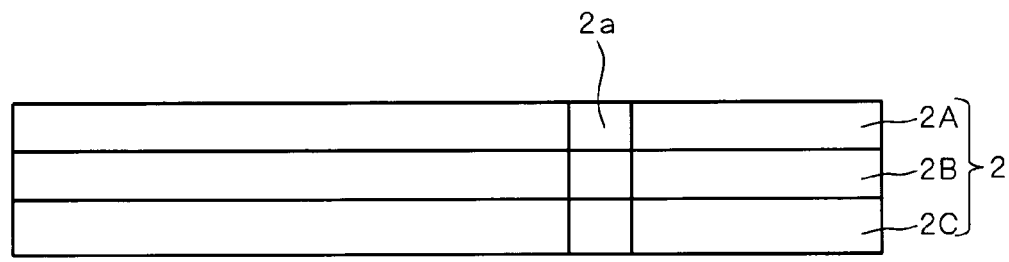

Next, as shown in FIG. 4, the layers 2A to 2C are superimposed on one another while being positionally adjusted so that the centers of diameters of the openings 2aa to 2ac should be aligned. After superimposition, the layers 2A to 2C are joined.

If the low melting point glass layer 2B is used as an intermediate layer, the layers 2A to 2C are welded by heat treatment. If the silicon layer 2B is used as an intermediate layer, the layers 2A to 2C are joined by anodic bonding. The multilayer second substrate 2 having the opening 2a of small diameter is thereby formed.

On the other hand, a bulk silicon 10 having a thickness of about 625 μm is prepared. Anisotropic etching is performed to remove part of an upper surface of the silicon 10 (above the movable mass body 4 which is formed later) by about 10 μm. The silicon 10 after being anisotropically etched is shown in FIG. 5.

Figure 5:
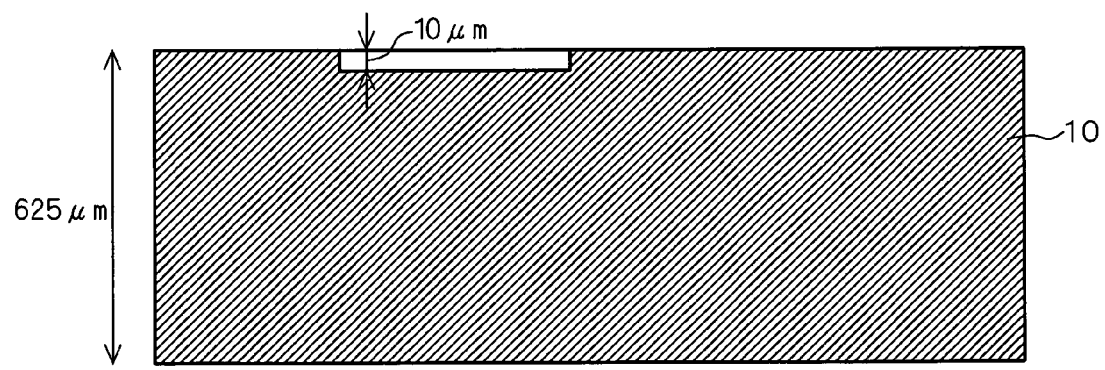
Figure 6:
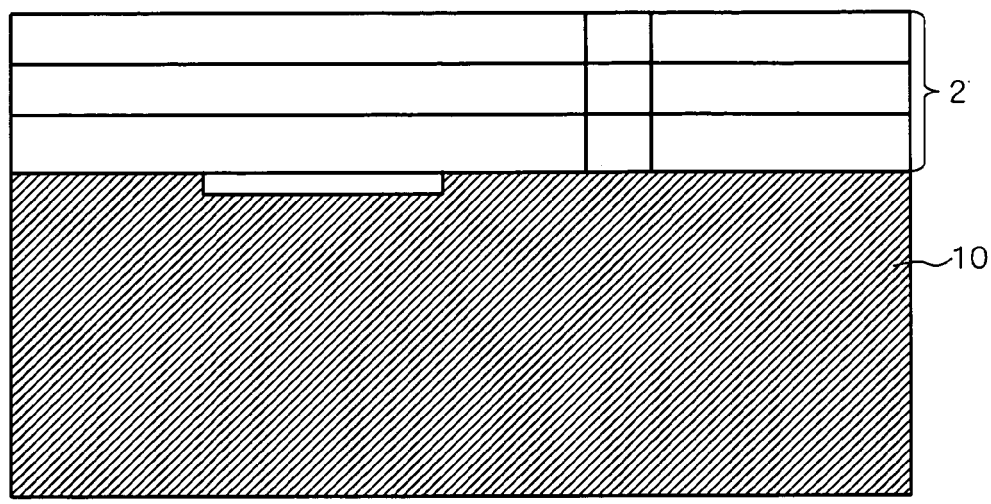

Next, the upper surface of the silicon 10 shown in FIG. 5 and the lower surface of the multilayer second substrate 2 shown in FIG. 4 are joined by anodic bonding. The substrates after being anodically bonded is shown in FIG. 6.

Figure 7:
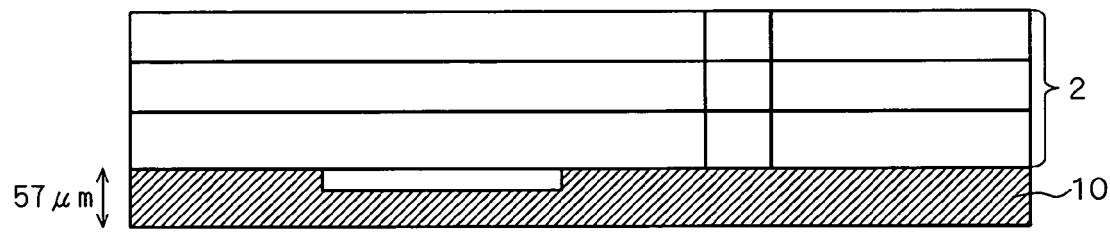

Next, polishing is performed on a lower surface of the silicon 10 after being anodically bonded so that the thickness of the silicon 10 should be about 57 μm as shown in FIG. 7.

Next, anisotropic etching is performed on the lower surface of the silicon 10 after being polished. The sensor portion (the movable mass body 4 and the fixed electrode 5), the electrode portion 7, the frame body 6 and the like are thereby patterned in the silicon 10 as shown in FIG. 8.

On the other hand, the first substrate 1 formed of glass or the like, having a thickness of about 400 μm is prepared. Part of an upper surface of the first substrate 1 is removed by anisotropic etching. The first substrate 1 after the removal is performed is shown in FIG. 9.

Figure 8:
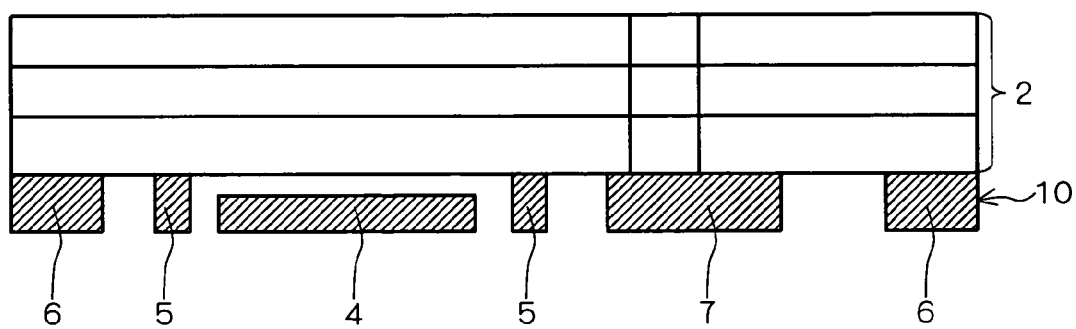
Figure 9:
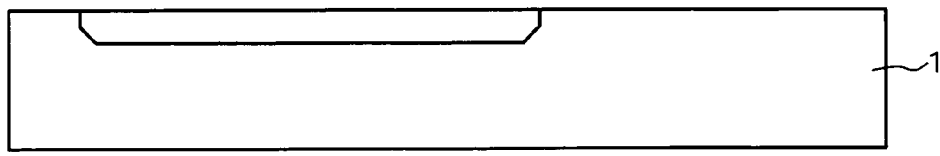
Figure 10:
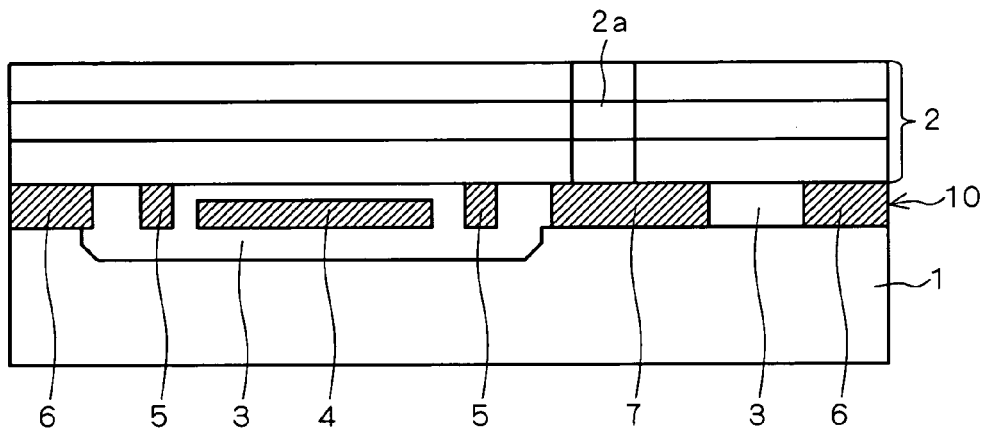

Next, as shown in FIG. 10, the lower surface of the silicon 10 of FIG. 8 and the upper surface of the first substrate 1 of FIG. 9 are joined by anodic bonding.

As shown in FIG. 10, the cavity portion 3 is formed between the multilayer second substrate 2 and the first substrate 1 and in the cavity portion 3, the sensor portion (the movable mass body 4 and the fixed electrode 5), the electrode portion 7 are provided. Further, the frame body 6 is so formed as to surround the cavity portion 3 and held by the multilayer second substrate 2 and the first substrate 1 in an outer peripheral portion. The movable mass body 4 is so provided as to be freely movable in the cavity portion 3.

Figure 11:
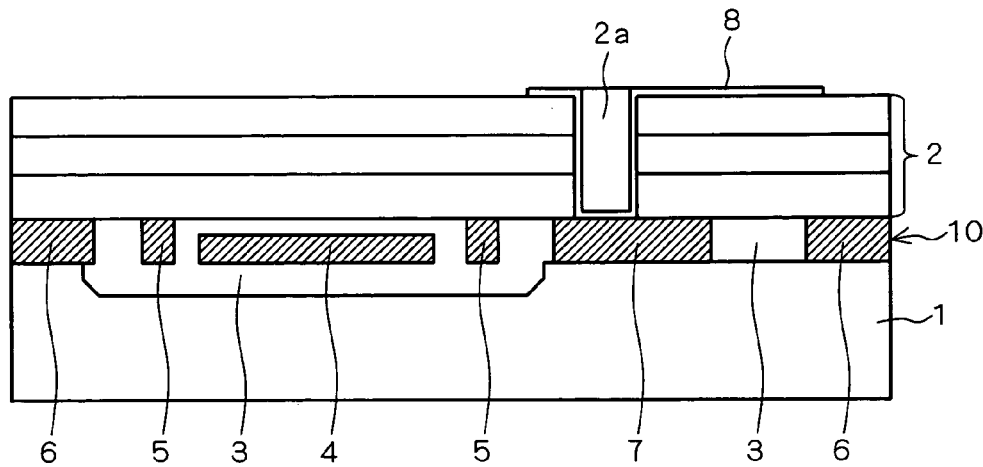

Next, evaporation of aluminum is performed on the structure of FIG. 10 from the upside. By this evaporation, as shown in FIG. 11, the electrode wire 8 of aluminum having a thickness of about 3 μm is formed. The electrode wire 8 is formed from the inside of the opening 2a up to part of the upper surface of the multilayer second substrate 2. Further, the electrode wire 8 is connected to the electrode portion 7 at the bottom of the opening 2a. In the upper surface of the multilayer second substrate 2, the electrode wire 8 is formed to have a substantially rectangular shape in a plan view.

After that, the external wire 9 is connected to the electrode wire 8 which is provided on the upper surface of the multilayer second substrate 2. This connection can be performed by wire bonding with ultrasound.

Through the above process steps, the acceleration sensor having the structure shown in FIGS. 1 and 2 is completed.

The acceleration sensor of the first preferred embodiment has the structure in which the multilayer second substrate 2 consists of a plurality of layers 2A to 2C, as discussed above. Since each of the layers 2A to 2C has a thickness smaller than the thickness of the whole multilayer second substrate 2, the following effect is produced.

In the case where the opening 2a is formed by sandblasting, the opening 2a has a cross-sectional shape like a bowl. In other words, the diameter of the opening 2a becomes larger from the bottom of the opening 2a towards the top thereof. Therefore, when the opening 2a is formed in the thick second substrate by sandblasting, the diameter of the opening 2a at its top disadvantageously becomes very large.

Considering a case where sandblasting is performed on the second substrate having a thickness of about 300 μm to form the opening 2a, for example, if the diameter of the opening 2a at its bottom is about 50 to 200 μm, the diameter of the opening at its top is about 400 μm or more.

If the acceleration sensor of the first preferred embodiment is adopted, however, since the openings 2aa to 2ac are formed individually and independently in the thin layers 2A to 2C, respectively, it is possible to suppress the diameters of the openings 2aa to 2ac at their tops and consequently possible to reduce the diameter at the top of the opening 2a of the multilayer second substrate 2.

Considering a case where sandblasting is performed on the layers 2A to 2C each having a thickness of about 100 μm to form the openings 2aa to 2ac, for example, if the diameter of each of the openings. 2aa to 2ac at its bottom is about 50 to 200 μm, the diameter of each of the openings 2aa to 2ac at its top is about 200 to 300 μm.

Therefore, the diameter of the opening 2a of the multilayer second substrate 2 is about 200 to 300 μm at its top (the diameter of the opening 2a of the multilayer second substrate 2 is about 50 to 200 μm at its bottom).

As discussed earlier, the electrode portion 7 is required to have a size larger than the expected largest diameter of the opening 2a. In the background-art case, if the diameter of the opening at its bottom is about 50 to 200 μm, the size of the electrode portion is required to be larger than the expected largest diameter of the opening of about 400 μm.

When the acceleration sensor of the first preferred embodiment is adopted, if the diameter of the opening 2a at its bottom is about 50 to 200 μm, the size of the electrode portion 7 has only to be larger than the expected largest diameter of the opening 2a of about 200 to 300 μm.

As can be seen from the comparison of these cases, in the acceleration sensor of the first preferred embodiment, it is possible to set the size of electrode portion 7 smaller.

Thus, since adopting the acceleration sensor of the first preferred embodiment allows reduction in size of the electrode portion 7, it is consequently possible to reduce the whole size of the acceleration sensor. In other words, by adopting the acceleration sensor of the first preferred embodiment, it is possible to form the opening 2a facing on the electrode portion 7 in the second substrate 2 while suppressing an increase of the whole size of the acceleration sensor.

The materials, size and the like of the constituent members are exemplary ones and not limited to these ones. Especially, the number of layers 2A to 2C constituting the multilayer second substrate 2 is not limited to three like in the above case but may be two, or four or more. As the number of layers of the multilayer second substrate 2 increases, the thickness of each layer can be made smaller.

The Second Preferred Embodiment

In the first preferred embodiment, the openings 2aa to 2ac formed in the layers 2A to 2C, respectively, have almost the same size and cross-sectional shape. The first preferred embodiment having such a structure has the following problem.

Figure 12:
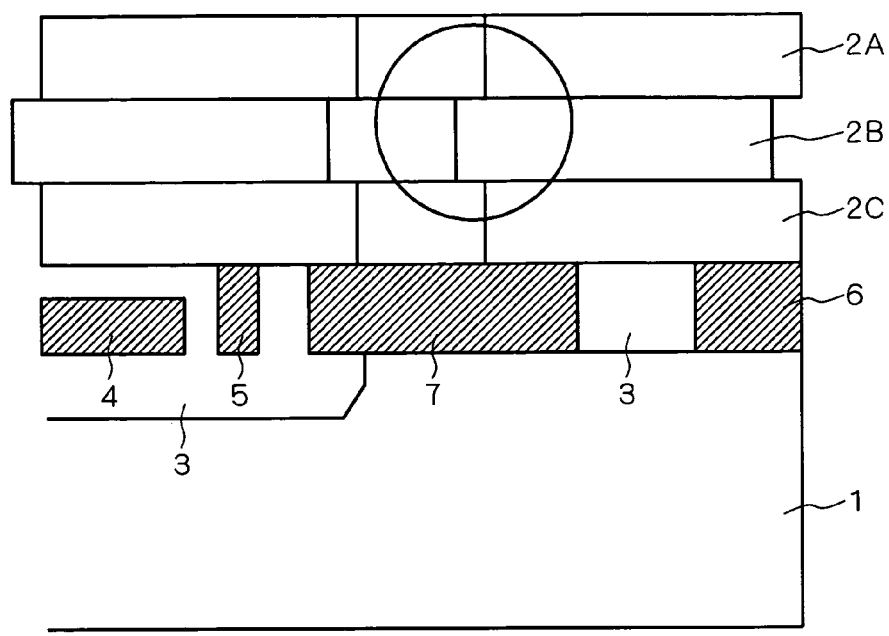
FIG. 12 is a cross section showing a problem of the acceleration sensor in accordance with the first preferred embodiment.

In superimposition of the layers 2A to 2C (see FIG. 4), which is needed to form the multilayer second substrate 2, the center of diameter of the opening in the upper layer is laterally deviated from that of the opening of the lower layer in some cases. An exemplary misalignment is shown in FIG. 12. In FIG. 12, the center of diameter of the opening of the layer 2B is deviated leftward from that of the opening of the layer 2C.

If there is such a misalignment, in a portion surrounded by the circle (FIG. 12), for example, the layer 2B serves as a cover of the layer 2C in placement process of the electrode wire 8 (evaporation process). Therefore, the electrode wire 8 can not be correctly placed in the portion surrounded by the circle and there disadvantageously arises a broken wire.

Figure 13:
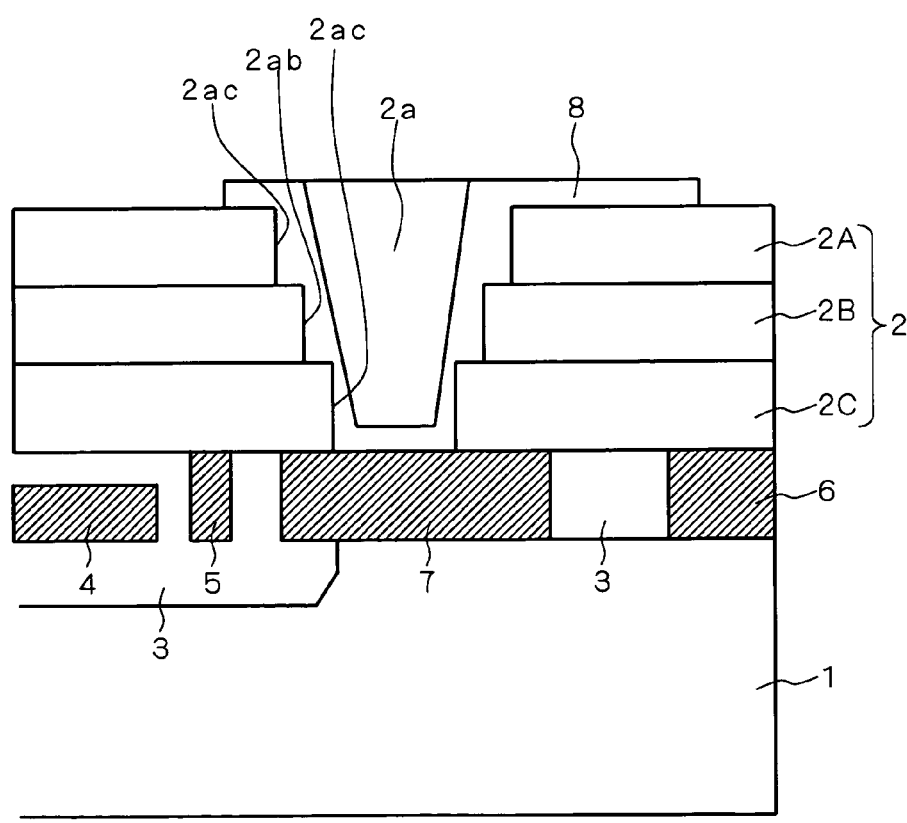
FIG. 13 is an enlarged cross section showing a structure of an acceleration sensor in accordance with a second preferred embodiment.

Then, in the acceleration sensor of the second preferred embodiment, the diameter of the opening formed in the upper layer is made larger than that of the opening formed in lower layer. The acceleration sensor having such openings with the above structure is shown in FIG. 13. FIG. 13 is an enlarged cross section showing a structure of part of the acceleration sensor, i.e., the electrode portion 7, the opening 2a and their vicinity.

As shown in FIG. 13, the acceleration sensor of the second preferred embodiment has a structure in which the opening 2a has a cross-sectional shape which becomes wider from the bottom toward the top like steps.

In other words, the diameter of the bottom of the opening 2ab in the intermediate layer 2B is larger than that of the top of the opening 2ac in the bottom layer 2C. Further, the diameter of the bottom of the opening 2aa in the top layer 2A is larger than that of the top of the opening 2ab in the intermediate layer 2B.

If the openings 2aa to 2ac are formed in the layers 2A to 2C by sandblasting, the openings 2aa to 2ac have the cross-sectional shape like a bowl. In FIG. 13, however, for simple illustration, the cross section of each of the openings 2aa to 2ac has a substantially rectangular shape.

The structure except the cross-sectional shape of the opening 2a is the same as that of the first preferred embodiment, and discussion thereof will be omitted herein.

The acceleration sensor of the second preferred embodiment has a structure in which the opening 2a having a step-like cross-sectional shape is formed. Therefore, in superposition of the layers to form the multilayer second substrate 2, even if the upper layer is laterally deviated from the lower layer to some degree, it is possible to prevent the upper layer from serving as a cover of the lower layer in placement process of the electrode wire 8 (evaporation process).

Thus, since the misalignment of the layers is allows to some degree, formation of the multilayer second substrate 2 (superimposition of layers) becomes easier. Further, even if there is a misalignment of the layers to some degree, it is possible to prevent the electrode wire 8 from being broken.

The Third Preferred Embodiment

A structure of an acceleration sensor of the third preferred embodiment is shown in FIG. 14. FIG. 14 is an enlarged cross section showing a structure of part of the acceleration sensor, i.e., the electrode portion 7, an opening 20a and their vicinity.

The acceleration sensor of the third preferred embodiment comprises the first substrate 1 and a second substrate 20 which is opposed to the first substrate 1 as shown in FIG. 14.

The second substrate 20 consists of a first layer 20D and a second layer 20U. Herein, the first layer 20D is opposed to the first substrate 1. The second layer 20U consisting of a plurality of layers is formed on a predetermined upper surface of the first layer 20D.

The first layer 20D has a thickness of about 100 μm and the whole second layer 20U has a thickness of about 200 μm (therefore, in the portion where the second layer 20U is formed, the whole thickness of the second substrate 20 is about 300 μm). The first substrate 1 has the same structure as that of the first preferred embodiment.

Further, as the first layer 20D, a glass layer, for example, can be adopted. The second layer 20U consists of, e.g., a glass layer (upper layer) 20U1 and a low melting point glass layer (silicon layer) (lower layer) 20U2.

In the first layer 20D and the second layer 20U, end portions on the side of the opening 20a have a step-like shape, which becomes wider from the bottom to the top. In other words, on the side of the opening 20a, the end portion of the layer 20U2 protrudes more than that of the layer 20U1, and the end portion of the first layer 20D protrudes more than that of the layer 20U2.

Like in the first preferred embodiment, in the sealed cavity portion 3 which is formed between the first substrate 1 and the second substrate 20 opposed to each other, the movable mass body 4 is formed. Further, in the neighborhood of the movable mass body 4, the fixed electrode 5 is formed in the cavity portion 3. The frame body 6 is formed, being held by the first substrate 1 and the second substrate 20 in the outer peripheral portion of these substrates 1 and 20. The frame body 6 surrounds the cavity portion 3. Further, the electrode portion 7 is formed in the cavity portion 3, and the electrode portion 7 is connected to either the sensor portion (the movable mass body 4 and the fixed electrode 5) or the frame body 6.

In the acceleration sensor of the third preferred embodiment, as shown in FIG. 14, only the first layer 20D is formed over the frame body 6. Specifically, only the first layer 20D is formed over a portion extending from an upper surface of the frame body 6 to part of an upper surface of the electrode portion 7 with the cavity portion 3 interposed therebetween.

Further, as shown in FIG. 14, the second layer 20U is laminated on the first layer 20D above the sensor portion. More specifically, the second layer 20U is laminated on the first layer 20D above the sensor portion and on part of the upper surface of the electrode portion 7.

In other words, only the first layer 20D is formed on a portion in the cavity portion 3 which is mechanically strong against the external pressure from a vertical direction of the figure. On the other hand, the second layer 20U is also formed on a portion in the cavity portion 3 which is mechanically weak against the external pressure from a vertical direction of the figure. For example, as can be seen from FIG. 14, a portion in which the frame body 6 is formed is mechanically strong against the external pressure from a vertical direction of the figure. A portion of the cavity portion 3 in which the movable mass body 4 and the fixed electrode 5 are formed, which has a large volume, is mechanically weak against the external pressure from a vertical direction of the figure.

In the first layer 20D, the opening 20a is so formed as to face on the upper surface of the electrode portion 7.

The electrode wire 8 is formed in the opening 20a, extending up to part of the upper surface of the second substrate 20. The electrode wire 8 has a pad portion in the upper surface of the first layer 20D, which is connectable to the external wire 9. Further, the electrode wire 8 is connected to the electrode portion 7.

The second substrate 20 included in the acceleration sensor of the third preferred embodiment can be formed, for example, in the following manner.

First, the first layer 20D formed of glass or the like is prepared. Further, the low melting point glass layer (or silicon layer) 20U2 having a width smaller than that of the first layer 20D and th glass layer 20U1 having a width smaller than that of the low melting point glass layer (or silicon layer) 20U2 are prepared.

Next, the opening 20a is formed by, e.g., sandblasting in a predetermined portion of the first layer 20D. After that, the low melting point glass layer (or silicon layer) 20U2 is placed (superimposed) on a predetermined portion of the upper surface of the first layer 20D and the glass layer 20U1 is placed (superimposed) on a predetermined portion of the upper surface of the low melting point glass layer (or silicon layer) 20U2.

Specifically, the second layer 20U is placed on the first layer 20D formed on a region in which the movable mass body 4 and the fixed electrode 5 are formed. Further, the first layer 20D and the second layer 20U are placed so that the end portions of the layers 20D, 20U1 and 20U2 on the side where the opening 20a is formed should become wider from the bottom to the top in a step-like manner in a cross-sectional view.

After the above superimposition, the layers 20D and 20U are joined (through e.g., weld bonding by heating, anodic bonding or the like).

Thus, the second substrate 20 of the third preferred embodiment, which has the opening 20a, is completed.

The acceleration sensor of the third preferred embodiment has the second substrate 20 having the above structure. Therefore, by perform a sandblasting process on the thin first layer 20D, it is possible to form the opening 20a having a small diameter like in the first preferred embodiment (further, since the size of the electrode portion 7 can be reduced, the whole size of the sensor portion can be reduced).

Further, in the acceleration sensor of the third preferred embodiment, the second layer 20U is formed only on the portion of the cavity portion 3 which is mechanically weak against the external pressure from a vertical direction of the figure. Therefore, it is possible to reduce the manufacturing cost and the weight of the whole acceleration sensor as compared with the case where the second substrate 20 is entirely constituted of a plurality of layers.

Furthermore, in the acceleration sensor of the third preferred embodiment, the electrode wire 8 is formed from the inside of the opening 20a up to the upper surface of the first layer 20D and has the pad portion in the upper surface of the first layer 20D.

Therefore, if the first layer 20D and the second layer 20U are not extremely deviated laterally from each other in superimposition of these layers, it is possible to prevent the upper layer from serving as a cover of the lower layer in a path from connection of the electrode wire 8 with the electrode portion 7 up to the upper surface of the first layer 20D in the formation of the electrode wire 8 (evaporation process). Therefore, it is possible to form the electrode wire 8 without being broken.

Though the case where the end portions of the first layer 20D and the second layer 20U on the side of the opening 20a has a step-like shape which becomes wider from the bottom to the top, there may be a case where the end portions do not have the step-like shape.

The materials, size and the like of the constituent members are exemplary ones and not limited to these ones. Especially, the number of layers 20U1 and 20U2 constituting the second layer 20U is not limited to two like in the above case but may be one, or three or more. As the number of layers of the multilayer second substrate 2 increases, the thickness of each layer can be made smaller.

While the invention has been shown and described in detail, the foregoing description is in all aspects illustrative and not restrictive. It is therefore understood that numerous modifications and variations can be devised without departing from the scope of the invention.

What is claimed is:

1. An acceleration sensor comprising:
   a first substrate;
   a multilayer second substrate consisting of a plurality of layers, being opposed to said first substrate, wherein each of said plurality of layers is made of glass or silicon, and each of said plurality of layers has an opening which extends through said layer, with the openings in said layers being aligned with one another to provide an electrode drawing opening that extends through the entirety of said multilayer second substrate; and
   a sensor portion provided in a sealed cavity portion formed between an upper surface of said first substrate and the lower surface of said multilayer second substrate which are opposed to each other.

2. The acceleration sensor according to claim 1, further comprising:
   a frame body held by said first substrate and said multilayer second substrate, surrounding said cavity portion; and
   an electrode portion provided in said cavity portion and connected to either said sensor portion or said frame body,
   wherein said electrode drawing opening is so formed as to face on a surface of said electrode portion in said multilayer second substrate,
   said acceleration sensor further comprising
   an electrode wire formed in said electrode drawing opening and connected to said electrode portion.

3. The acceleration sensor according to claim 2, wherein the diameter of said electrode drawing opening is larger in an upper layer of said multilayer second substrate than in a lower layer.

4. The acceleration sensor according to claim 1, wherein said electrode drawing opening extends through the entirety of said multilayer second substrate transverse to the plane of said multilayer second substrate.

5. The acceleration sensor according to claim 1, wherein said sensor portion comprises a movable mass body and a fixed electrode provided in said cavity portion.

* * * * *